US012763482B2

(12) United States Patent
Joubert et al.

(10) Patent No.: US 12,763,482 B2
(45) Date of Patent: Oct. 13, 2026

(54) APPARATUS OF MULTIFREQUENCY ELECTROMAGNETIC RESONATORS INDUCTIVELY COUPLED TO ONE ANOTHER FORMING AN ARRAY OF RESONATORS OR A METAMATERIAL, AND IMPLEMENTATION METHOD

(71) Applicants: UNIVERSITE PARIS-SACLAY, Gif-sur-Yvette (FR); CENTRE NATIONAL DE LA RECHERCHE SCIENTIFIQUE, Paris (FR); CY CERGY PARIS UNIVERSITÉ, Cergy (FR)

(72) Inventors: Pierre-Yves Joubert, Sceaux (FR); Yohan Le Diraison, Cachan (FR); Alexiane Pasquier, Pélissanne (FR); Stéphane Serfaty, Achères (FR)

(73) Assignees: UNIVERSITE PARIS-SACLAY, Gif-sur-Yvette (FR); CENTRE NATIONAL DE LA RECHERCHE SCIENTIFIQUE, Paris (FR); CY CERGY PARIS UNIVERSITÉ, Cergy (FR)

( * ) Notice: Subject to any disclaimer, the term of this patent is extended or adjusted under 35 U.S.C. 154(b) by 95 days.

(21) Appl. No.: 18/711,314

(22) PCT Filed: Nov. 18, 2022

(86) PCT No.: PCT/EP2022/082443

§ 371 (c)(1),
(2) Date: May 17, 2024

(87) PCT Pub. No.: WO2023/089115

PCT Pub. Date: May 25, 2023

(65) Prior Publication Data

US 2025/0007176 A1 Jan. 2, 2025

(30) Foreign Application Priority Data

Nov. 19, 2021 (FR) ........................................ 2112292
Jan. 26, 2022 (FR) ........................................ 2200687

(51) Int. Cl.
*H01Q 15/00* (2006.01)
*G01R 1/07* (2006.01)
(Continued)

(52) U.S. Cl.
CPC ........... *H01Q 15/0026* (2013.01); *G01R 1/07* (2013.01); *G01R 33/36* (2013.01); *H01Q 3/44* (2013.01); *H01Q 15/0086* (2013.01)

(58) Field of Classification Search
CPC .... A61B 5/05; A61B 5/00; G01R 1/07; G01R 27/26; G01R 27/2658; G01R 33/36;
(Continued)

(56) References Cited

U.S. PATENT DOCUMENTS 9,293,834 B2 * 3/2016 Latrach .............. H01Q 15/0026
9,595,765 B1 * 3/2017 Valayil .................. H01Q 13/18
(Continued)

FOREIGN PATENT DOCUMENTS

DE 102016104662 A1 9/2017
EP 3761441 A1 1/2021
(Continued)

OTHER PUBLICATIONS

International Search Report issued on Feb. 23, 2023, in corresponding International Application No. PCT/EP2022/082443, 4 pages.
(Continued)

*Primary Examiner* — Tho G Phan
(74) *Attorney, Agent, or Firm* — Maier & Maier, PLLC

(57) ABSTRACT

An array device composed of individual multifrequency passive resonators which are not electrically connected to
(Continued)

one another. These resonators are formed by interrupted transmission lines that close back in on themselves and which are nested within one another, each formed of a group of two or more parallel tracks, and are paired with one another contactlessly around one or more dielectric layers of a substrate. Such an array is used in particular to modify an incident magnetic or electromagnetic field, and/or to carry out impedance matching by being placed between an incident field and a body or object to be treated or observed. It is also used to improve a method for contactlessly characterizing a medium to be investigated, via inductive coupling of one or more of the resonators of said array to a probe connected to a reader.

14 Claims, 7 Drawing Sheets

(51) Int. Cl.
*G01R 33/36* (2006.01)
*H01Q 3/44* (2006.01)

(58) Field of Classification Search
CPC .... G01R 33/34; H01Q 15/00; H01Q 15/0026; H01Q 15/0086; H01Q 3/44
See application file for complete search history.

(56) References Cited

U.S. PATENT DOCUMENTS

| | | | | |
|---|---|---|---|---|
| 9,715,953 | B2 * | 7/2017 | Weldon | H01Q 15/0086 |
| 9,768,516 | B2 * | 9/2017 | Smith | H01P 1/2005 |
| 10,014,585 | B2 * | 7/2018 | Patron | H01Q 13/28 |
| 11,011,834 | B2 * | 5/2021 | Xu | H01Q 15/02 |
| 2019/0021626 | A1 | 1/2019 | Cano Garcia et al. | |
| 2020/0278304 | A1 | 9/2020 | Udpa et al. | |
| 2021/0393126 | A1 | 12/2021 | Dündar et al. | |

FOREIGN PATENT DOCUMENTS

| | | | |
|---|---|---|---|
| EP | 3840631 | A1 | 6/2021 |
| FR | 3129483 | A1 | 5/2023 |
| WO | 2017157690 | A1 | 9/2017 |
| WO | 2021001476 | A1 | 1/2021 |
| WO | 2023089110 | A1 | 5/2023 |

OTHER PUBLICATIONS

Search Report issued on Sep. 7, 2022, in corresponding French Application No. 2200687, 4 pages.

Portosi et al., "A Split Ring Resonator-Based Metamaterial for Microwave Impedance Matching with Biological Tissue", Applied Science, 2020, vol. 10, 14 pages.

Razzicchia et al., "Metamaterial Designs to Enhance Microwave Imaging Applications", International Conference on Electromagnetics in Advanced Applications, 2019, 6 pages.

Office Action issued on Jun. 16, 2026, in corresponding Japanese Application No. 2024-529936, 6 pages.

Zhou, et al., "2-D Near-Field Sensing Technique Using Singke-Port Coupled-Resonator Probe Arrays", IEEE Transactions On Microwave Theory and Techniques, May 2021, vol. 69, No. 5, pp. 2722-2729.

Office Action issued on Sep. 1, 2026, in corresponding Japanese Application No. 2024-529936, 6 pages.

Wang et al., "Design and Fabrication of a Triple-Band Terahertz Metamaterial Absorber", Nanomaterials, MDPI, Apr. 25, 2021, vol. 11, No. 5:1110, pp. 1-13.

Turkmen et al., "A New Multi-Ring SRR Type Metamaterial Design with Multiple Magnetic Resonances", Progress in Electromagnetics Research Symposium Proceedings, Mar. 20-23, 2011, pp. 315-319.

* cited by examiner

Fig.13
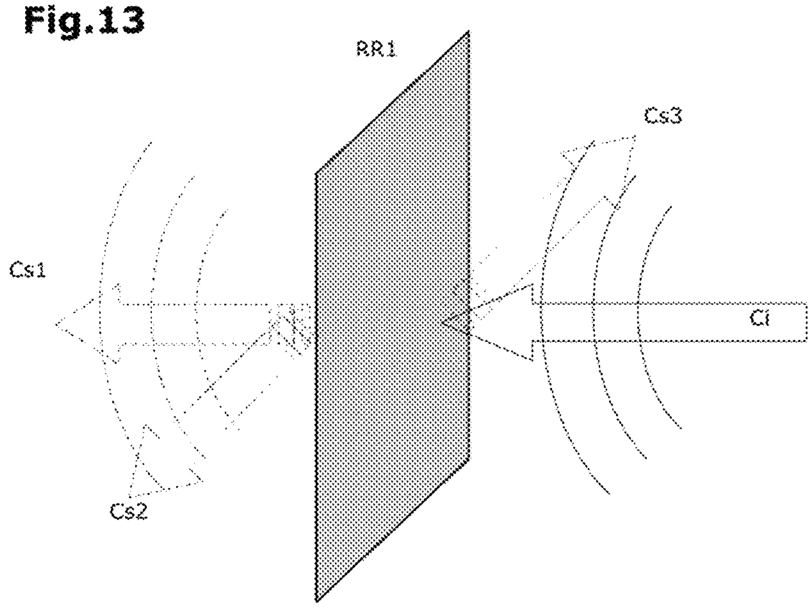
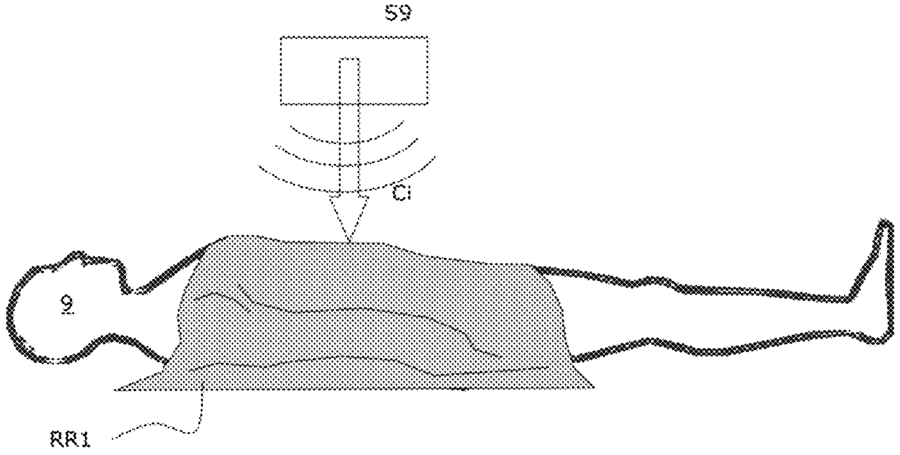
Fig.14

APPARATUS OF MULTIFREQUENCY ELECTROMAGNETIC RESONATORS INDUCTIVELY COUPLED TO ONE ANOTHER FORMING AN ARRAY OF RESONATORS OR A METAMATERIAL, AND IMPLEMENTATION METHOD

FIELD

The invention relates to an array device composed of individual multifrequency passive resonators which are not electrically connected to one another. These resonators are formed by interrupted transmission lines that close back in on themselves and which are nested within one another, each formed of a group of two or more parallel tracks, and are paired with one another contactlessly around one or more dielectric layers of a substrate. Such an array is used in particular to modify an incident magnetic or electromagnetic field, and/or to carry out impedance matching by being placed between an incident field and a body or object to be treated or observed. It is also used to improve a method for contactlessly characterizing a medium to be investigated, via inductive coupling of one or more of the resonators of said array to a probe connected to a reader

BACKGROUND

It is known practice to use electromagnetic resonators grouped together in an array to obtain a "metamaterial" effect which gives an overall effect on an electromagnetic field that is different from the effect that would be obtained by the one or more constituent materials of this metamaterial.

Such metamaterials are often made using regularly spaced resonators, which are connected to one another by an electrical connection or by electrically coupled transmission lines; they mainly interact with the electric field.

For example, document US2019/0021626 relates to an antenna and a microwave tomography system, which are used for detection and diagnosis on the human body. This document proposes placing a metamaterial between the antenna and the skin, the metamaterial being used for impedance matching with human tissues to facilitate penetration. This metamaterial is formed by an array of single-frequency copper elements on a dielectric support. The resonance frequency can be static, or it can be adjusted by means such as MEMS controlled by a voltage, or a microfluidic flow that changes the dielectric properties of the metamaterial, or optically by using a photosensitive material, the dielectric properties of which are changed by illumination.

The following publications propose a metamaterial formed by regularly repeating an SRR (split-ring resonator) single-frequency resonator to improve the performance of a microwave monitoring or imaging system:

Razzicchia, E., Koutsoupidou, M., Cano Garcia, H., Sotiriou, I., Kallos, E., Palikaras, G., & Kosmas, P. (2019): "Metamaterial designs to enhance microwave imaging applications". In Proceedings of the 2019 21st International Conference on Electromagnetics in Advanced Applications, ICEAA 2019 (pp. 147-150).

Vincenza Portosi, Antonella Maria Loconsole and Francesco Prudenzano: "A Split Ring Resonator-Based Metamaterial for Microwave Impedance Matching with Biological Tissue". In Applied Sciences 2020, 10, 6740.

However, such metamaterials remain difficult to produce and adjust, and would benefit from development in a number of directions, in particular in terms of robustness and versatility of application.

One aim of the invention is to overcome all or some of the drawbacks of the prior art. In particular, the invention seeks to provide devices and methods based on electromagnetic resonators that are more effective, flexible, varied in terms of applications, and simple and flexible to manufacture and use.

SUMMARY

The invention provides a device comprising a plurality of passive multifrequency electromagnetic resonators, i.e. each having a plurality of given resonance frequencies. In particular, but not necessarily, these resonators share at least one resonance frequency, referred to as a common resonance frequency, between them. Each of said resonators comprises a plurality of galvanically isolated (from one another and with respect to outside the resonator) transmission lines, having different resonance frequencies from one another, and each forming a path that closes back in on itself and is interrupted by one or more splits. Said transmission lines are arranged spatially relative to one another such that, when said device is subjected to what is referred to as an incident field, they share between them a common interaction region in which the field lines of said incident field interact with said plurality of transmission lines. It is to be understood that this incident field can be an electric, magnetic or electromagnetic field. According to the invention, these resonators are themselves arranged, within said array, without electrical contact between them and so that they are sufficiently close to one another to form an array of resonators that can interact with one another through inductive coupling.

An array of resonators is thus obtained which are separated (spatially and electrically) from one another and distributed so as to cover a certain area, or even a certain volume, while interacting inductively to produce a collective reaction.

These resonators are, for example, multifrequency resonators as described in application FR2112292 by the same inventors. The specific features described in this application are also applicable to the present invention.

According to one specific feature of the invention, the resonators of this array (all or at least a plurality thereof) each comprise one or more transmission lines which are each formed by a group of at least two interrupted tracks. In each group, these tracks are arranged parallel to one another but without electrical contact between them and describing the same common path. In such a group, the one or more interruptions of each of the tracks of said group are each arranged facing a solid portion of another track of said group, in particular of all of the other tracks of said group.

An array of resonators is thus obtained which specifically promotes inductive and magnetic interactions.

Typically, all or some of the multifrequency resonators each comprise a plurality of transmission lines nested within one another, in particular within a two-dimensional surface (which can be planar or non-planar, for example cylindrical or conical, adjusted or otherwise).

A plurality of the multifrequency resonators of the device according to the invention can each comprise a plurality of transmission lines each formed by at least two tracks arranged on two opposite faces of a two-dimensional dielectric substrate, in particular the same substrate common to all or some of the transmission lines of the same multifrequency resonator.

The various tracks of the same group of tracks are, for example, deposited on both faces of an insulating substrate layer, or three or more tracks positioned between insulating substrate layers.

Optionally, these one or more substrates are arranged so as to be able to modify the dielectric properties thereof, thereby modifying the resonance frequency of the tracks of each group, and therefore modify the resonance frequencies of each resonator. This modification is obtained, for example, by using a layer of a piezoelectric material, which is electrically controlled to vary the thickness thereof; or by incorporating microfluidic channels into this substrate, wherein the overall dielectric properties of the substrate are made to vary by injecting a fluid into or removing a fluid from these channels; or by using any known means for varying and/or controlling (or "activating") such a change in the dielectric properties thereof.

Such an array can be used in different ways. According to one family of embodiments, it can in particular be used within an incident field that surrounds or passes through said array.

Metamaterial

Thus, according to one specific feature, the multifrequency resonators are arranged, without electrical contact between them, in a spatially periodic structure arranged to form an electromagnetic metamaterial capable of interacting with an external electromagnetic field, referred to as an incident field.

According to another aspect of the invention, a method is provided for modifying the interaction of a living body or of an object with an incident electromagnetic field. This method then comprises placing, holding or activating a device as disclosed herein around said body or object or between same and a source of said incident field.

This type of metamaterial use allows different uses according to different specific features which are not exclusive of one another.

According to one specific feature, the resonators are designed and arranged so as to interact with an incident electromagnetic field in such a way as to filter or attenuate all or some of the frequencies other than the resonance frequencies of said resonators.

Thus, for example, a filtering effect is obtained, especially by absorbing, re-emitting the resonance frequencies in particular. It can, for example, involve producing a screen between the incident field and a target object, for example to protect it from the resonance frequencies. It can also, for example, involve producing a screening effect, for example by allowing only the resonance frequencies through across a very small frequency band, of about 100 kHz for example. A very high quality factor is thus obtained.

According to another specific feature, the resonators are designed and arranged so as to interact with an electromagnetic field passing through the device in such a way as to amplify the intensity thereof in the resonance frequencies of the resonators, via magnetic induction at these frequencies.

It thus becomes possible to amplify the effects of certain frequencies, and thereby improve a method based on these frequencies, for example detection, imaging or treatment.

According to yet another specific feature, the resonators are designed and arranged so as to interact with an incident electromagnetic field in such a way as to deflect or reflect all or some of the intensity thereof in one or more frequencies.

By inserting the array between the incident field and a body or an object, it is thus possible to protect this target object from the incident field, in terms of intensity and/or in terms of modifying a signature or an image obtained by said incident field or the responses that it brings about in said body or object.

Impedance Matching

According to one family of embodiments, which is not exclusive of the preceding family, the resonators are designed and arranged so as to interact with an electromagnetic field passing therethrough in such a way as to modify/match the impedance of an incident signal carried by said electromagnetic field or of an answer signal brought about by said field and passing through said device.

The invention thus makes it possible to produce an impedance-matching device that modifies, adjusts or improves the performance of a detection, imaging or processing method based on electromagnetic waves, for example microwave tomography or MRI. Such a modification can be applied, for example, to the precision, penetration, depth of investigation, or nature of the tissues or materials to be observed or treated, and over a wider or more flexible frequency range. It can also allow the side effects of such a treatment or observation on the tissues to be minimized.

According to one specific feature, the device disclosed herein comprises a flexible or rigid film bearing all or some of the resonators of said device, which film is arranged so as to envelop a living or non-living body, referred to as the target object, in order to modify the interaction thereof with the electromagnetic field, in particular in order to protect said target object or to optimize a treatment or an investigation carried out on said target object by means of said electromagnetic field.

Thus, an impedance-matching device that is easy and flexible to use, transport or store is produced, the device being comparable, for example, to a survival blanket, or allowing, for example, a flexible part to be produced for the purpose of local masking or to be worn as clothing ("wearable") or a dressing.

Contactless Characterization

According to yet another family of embodiments, which is not exclusive of the preceding families, the invention provides a method for contactlessly characterizing at least one region to be investigated within a medium to be characterized, this method comprising the following steps:

- contactlessly inductively coupling a probe, simultaneously, to one or more multifrequency resonators, referred to as probed resonators, constituting a subset of an array of resonators formed by a device as disclosed herein, said array being located in the vicinity of said investigated region but without requiring contact with said investigated region, such that the resonators of said array interact with the region to be investigated;
- measuring the variation in impedance of said probed resonators by means of a reader that interacts with said probe;
- processing said measurement of variation in impedance, comprising a spectral analysis according to frequency, so as to determine a plurality of individual impedances measured for a plurality of measurement frequencies;
- processing one or more of said individual impedances in order to extract one or more electrical properties of said investigated region.

Because of the coupling between the various resonators of the array, the impedance of the one or more resonators probed with the probe varies with the variations in the impedance of the other resonators, which are referred to as unprobed resonators. The interactions of the unprobed resonators with the medium to be characterized propagate, to a certain extent, toward the one or more probed resonators. From a probe that is directly coupled only to some resonators, the reader can thus extract electrical properties from regions that interact with other resonators farther away from the probe.

An improvement in a number of known problems in contactless investigation is thereby obtained. These include, for example, better robustness of measurements, for example with respect to the positioning of the probe relative to the medium, because a greater number of resonators are interrogated for the same probe.

This characterization method is based on the same principle as the method that uses a single multifrequency resonator as described in application FR2112292 by the same inventors. The various variants mentioned in this application are also applicable to the present method, for example in terms of the nature or structure of the resonators, or in terms of its management of the depth of the investigated region, or in terms of the various uses thereof.

According to one specific feature, the array comprises different types of multifrequency resonators having combinations of different frequencies, the resonators being spatially distributed within said array so that different regions have different combinations of frequencies, in particular by virtue of different resonators or different combinations of different resonators.

By coupling to the one or more probed resonators, whichever they are, the reader can thus analyze the variations in impedance for the various frequencies or frequency combinations of a large portion of the array, including multiple different regions even if they do not include any probed resonators.

By using a probe coupled to a resonator interacting with the medium in a first region, it is thus possible to extract electrical properties from the medium in a second region interacting with unprobed resonators.

As long as the spatial distribution of the resonators of different frequency combinations is known, the method thus provides characterization information that is spatially allocated across multiple regions, while probing only one region.

According to yet another aspect of the invention, a system for contactlessly characterizing at least one region referred to as an investigated region within a medium to be characterized is provided, the system comprising:

- at least one device as disclosed herein, forming an array of resonators that interact with one another via inductive coupling and the transmission lines of which interact with the region to be investigated, the device being intended to be arranged in the vicinity of said investigated region, but without requiring contact with said investigated region,
- at least one probe arranged so as to:
  - on the one hand, be coupled via inductive coupling to one or more resonators of said array of resonator (typically to only some of the resonators of the array) by means of an inductive loop circuit, and
  - on the other hand, interact with at least one reader;
- said reader being arranged so as to interact with said probe in such a way as to implement a characterization method as disclosed herein.

BRIEF DESCRIPTION OF THE DRAWINGS

Other features and advantages shall become evident from the detailed description of an entirely non-limiting embodiment, and from the enclosed drawings in which:

- 1*a* shows a resonator with four nested single-turn circular meshes, and
- 1*b* shows a resonator with eight nested single-turn circular meshes

FIG. 13 is a diagram showing a use of an array of multifrequency resonators arranged as a metamaterial in order to interact with an incident electromagnetic field;

FIG. 14 is a diagram showing a use of a flexible film bearing an array of multifrequency resonators arranged as a metamaterial in order to perform impedance matching by being positioned between an incident electromagnetic field and a body investigated using said field.

DETAILED DESCRIPTION

Individual Multifrequency Resonators

FIG. 1*a* to FIG. 4 show individual examples of multifrequency resonators, which can be used to produce a resonator array according to the invention.

Figure 3:
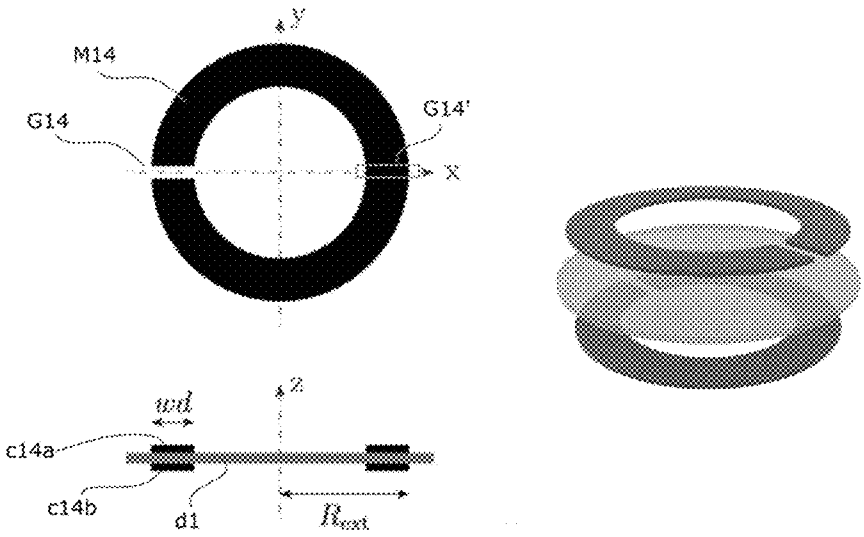
FIG. 3 is a partial schematic top view, cross-sectional view and exploded perspective view, showing an example of a single-turn circular elementary transmission line (or TLR), which can be used within a multifrequency resonator that can be used with various exemplary embodiments of the invention.
Figure 4:
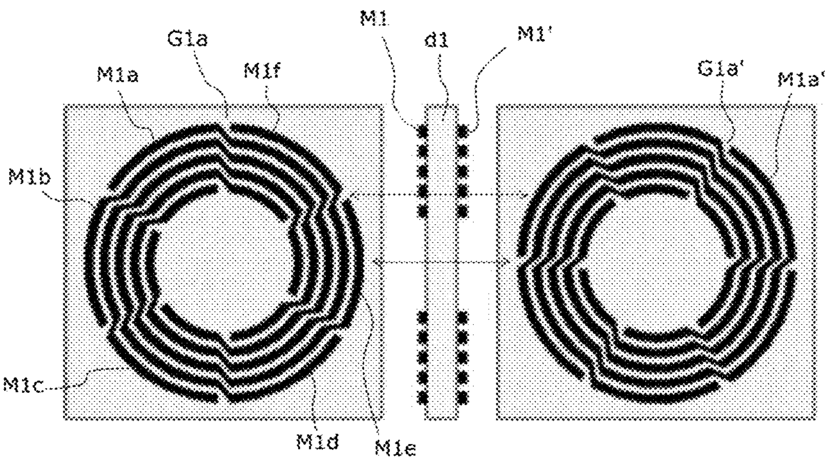
FIG. 4 is a partial schematic top view and cross-sectional view of a multi-split elementary transmission line (or TLR) that can be used within a multifrequency resonator that can be used with various exemplary embodiments, in one example with six circular transmission lines in portions and with decreasing radii, which are concentric with respect to one another and are offset by 60°, each formed by two tracks which are each arranged on one of the two faces of an insulating thin substrate, and facing one another and angularly offset with respect to one another.

FIG. 3 and FIG. 4 show the make-up of a transmission line M14, M1 that can be used to produce such a resonator. This transmission line is formed by a group of two interrupted tracks, which are arranged on both sides of a planar dielectric substrate d1 with an angular offset between the splits of the two tracks of each group.

These individual resonators are described in detail in application FR2112292 by the same inventors.

Method for Characterization by Means of a Multifrequency Resonator

Figure 5:
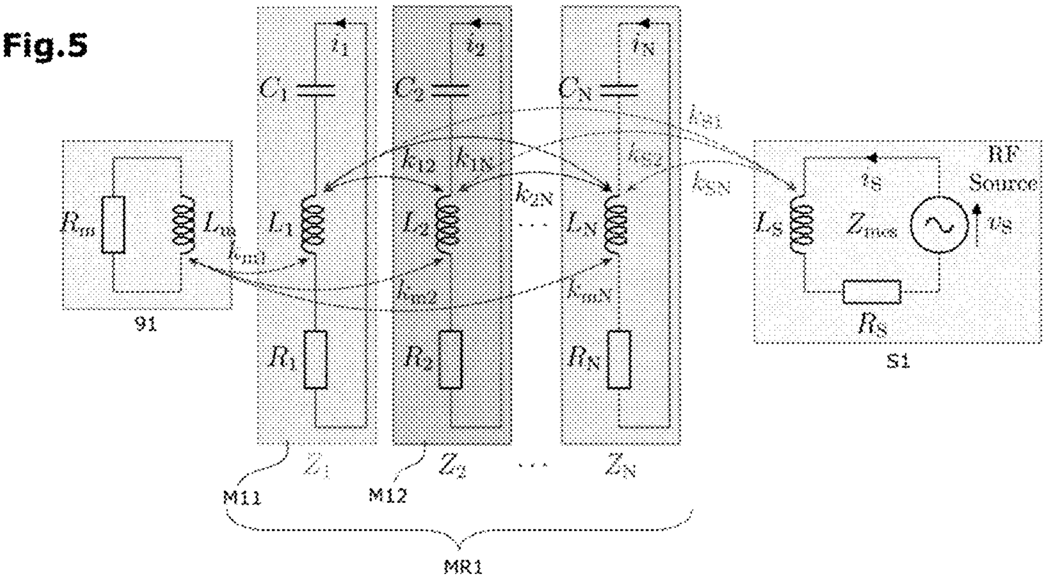
FIG. 5 is an equivalent circuit diagram of a resonator with "N" resonance frequencies, showing the interactions thereof with a probe and with a medium to be characterized.
Figure 6:
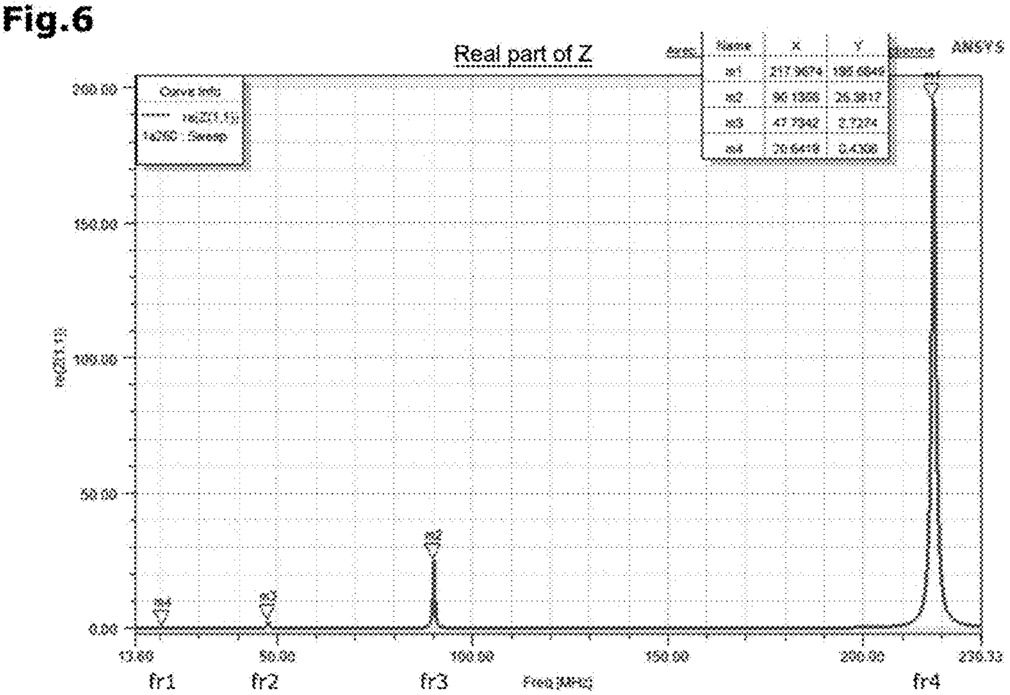
FIG. 6 is a curve showing, in a simulated manner, for the four-resonance resonator of FIG. 1*a* with no load, the real part of the measured impedance Zmes with frequency.
Figure 7:
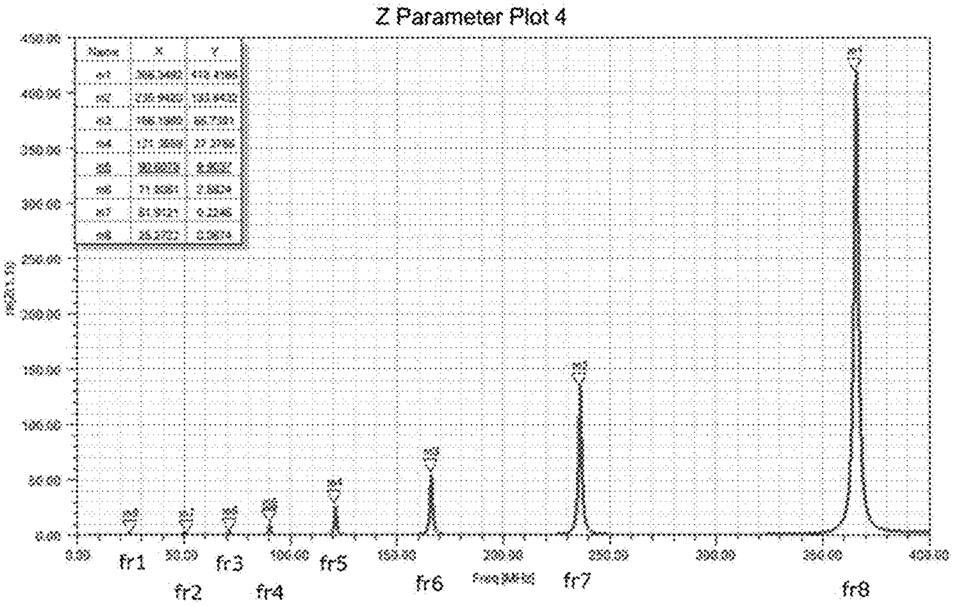
FIG. 7 is a curve similar to that of FIG. 6, simulated for the eight-resonance resonator of FIG. 1*b;*
Figure 8:
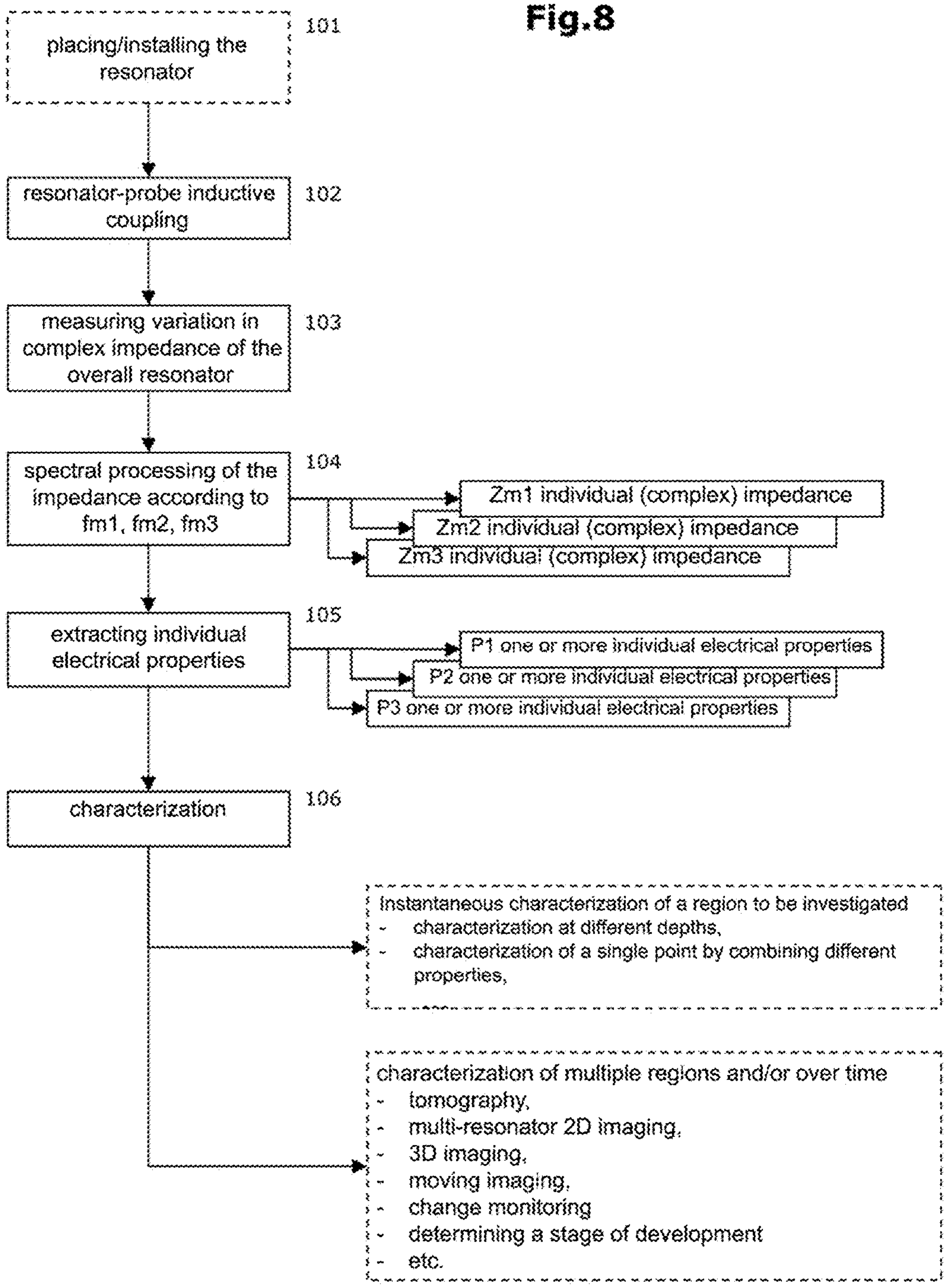
FIG. 8 is a flowchart schematically showing the operation of the characterization method used with a number of exemplary embodiments of the invention.

FIG. 5 shows the interactions of a resonator MR1 with "N" resonance frequencies, comprising N transmission lines Z1 to ZN, with a probe S1 in the context of a method for contactlessly characterizing a medium to be investigated. FIG. 6 and FIG. 7 show the impedance measurements which show peaks corresponding to the resonance frequencies of the individual multifrequency resonators of FIG. 1*a* and FIG. 1*b*, respectively. FIG. 8 shows the steps and applications of such a characterization method.

This method is described in detail in application FR2112292 by the same inventors.

Figure 1A:
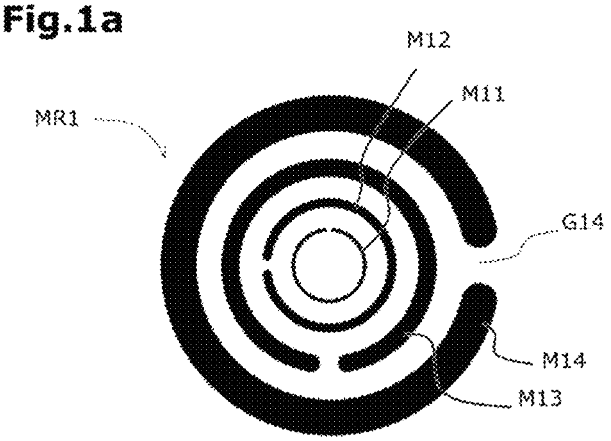
FIG. 1*a* and FIG. 1*b* are scale top views showing examples of multifrequency resonators that can be used with various embodiments of the invention, where.
Figure 1B:
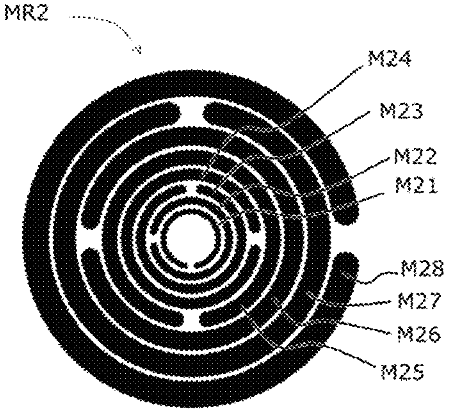
Figure 2:
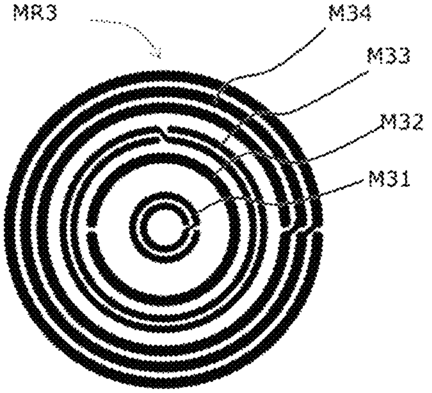
FIG. 2 is a scale top view showing an example of a multifrequency resonator that can be used with various embodiments of the invention, with four nested circular meshes, one of which is single-turn and the other of which is multi-turn.
Figure 9:
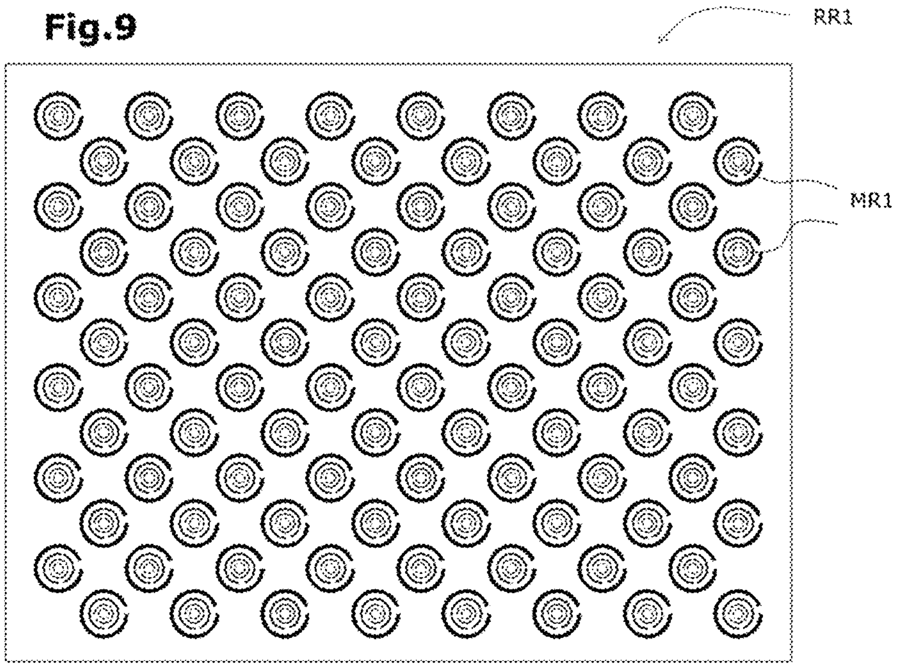
FIG. 9 is a schematic plan view showing an example of an array of multifrequency resonators according to an exemplary embodiment of the invention with four-frequency resonators which are all identical to one another.

FIG. 9 shows an exemplary array RR1 of multifrequency resonators according to an exemplary embodiment of the invention with four-frequency resonators MR1 which are all identical to one another and are similar to the resonator of FIG. 1*a*, and which are produced on both faces of a planar dielectric substrate.

Figure 10:
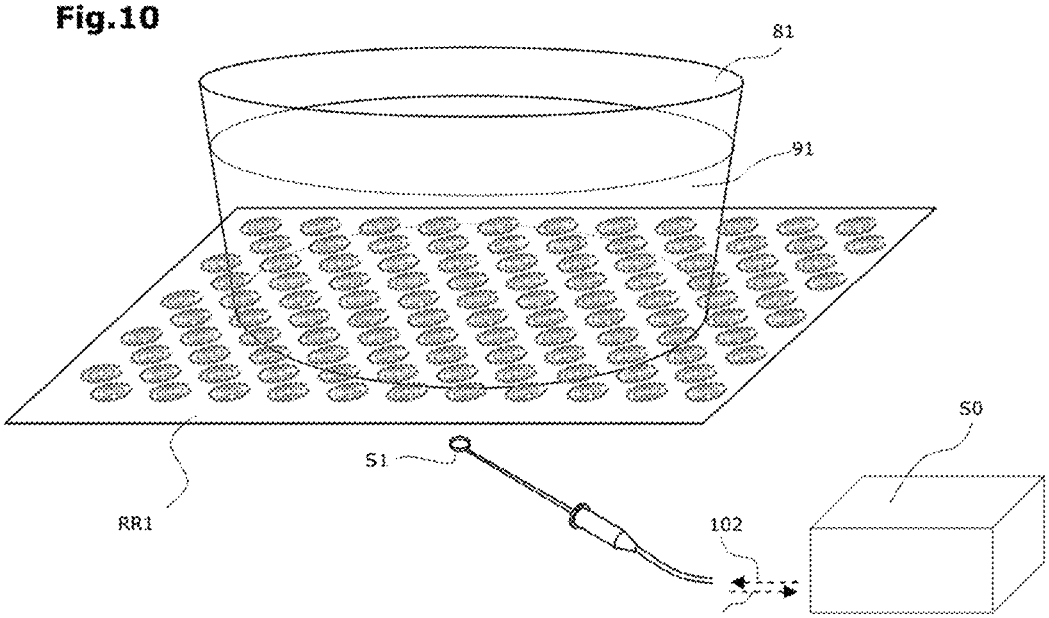
FIG. 10 is a diagram showing a use of an array of multifrequency resonators of the same type as that of FIG. 9 (or FIG. 11) as a contactless sensor for characterizing a medium using a single-channel inductive probe.

FIG. 10 shows a use of an array of multifrequency resonators of the same type as that of FIG. 9 (or FIG. 11) as a contactless sensor for characterizing a medium using an inductive probe S1 connected via a single channel 102 to a reader S0, for example a vector analyzer.

Figure 11:
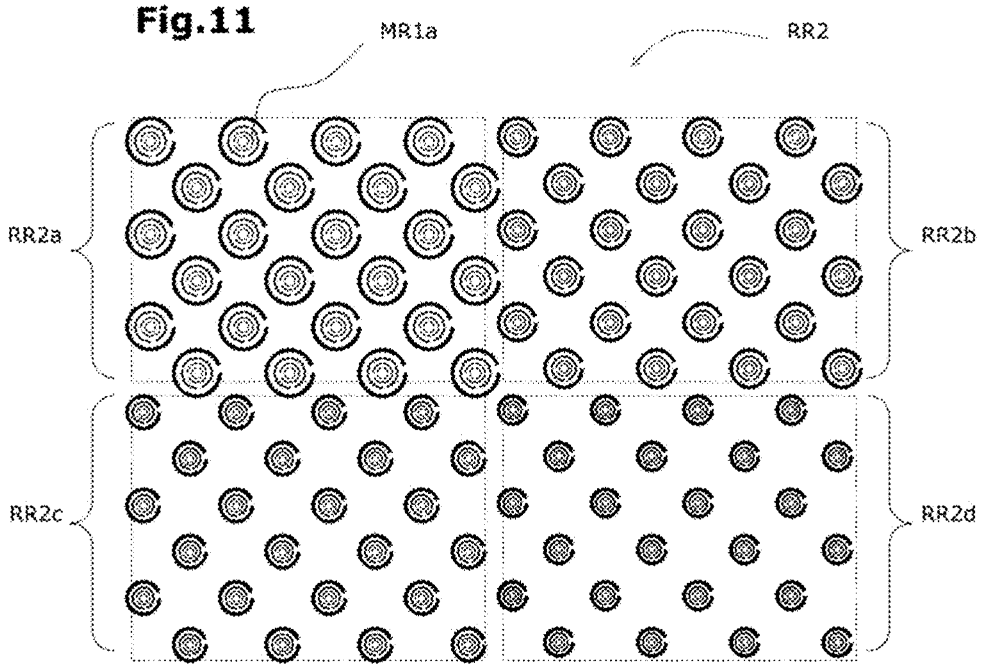
FIG. 11 is a schematic plan view showing an example of an array of multifrequency resonators according to an exemplary embodiment of the invention with four-frequency resonators of multiple different types, distributed in spatially distinct regions.

FIG. 11 shows an example of an array RR2 of multifrequency resonators according to an exemplary embodiment of the invention with four-frequency resonators of multiple different types MR1*a*, MR1*b*, MR1*c*, MR1*d*, in this instance resonators similar to the resonator of FIG. 1*a* but of different sizes and with different combinations of resonance frequencies. In this array, the different types of resonators are distributed in four spatially distinct regions RR2*a*, RR2*b*, RR2*c*, RR2*d*.

Because of the inductive interaction present between the resonators of the same array RR2, an inductive probe S1 coupled to one MR1*a* of the resonators of one in one region RR2*a* measures impedances not only for each of the resonance frequencies of the "probed" resonator but also impedances for the resonance frequencies of the other types of resonators and from the other regions of the array RR2.

Figure 12:
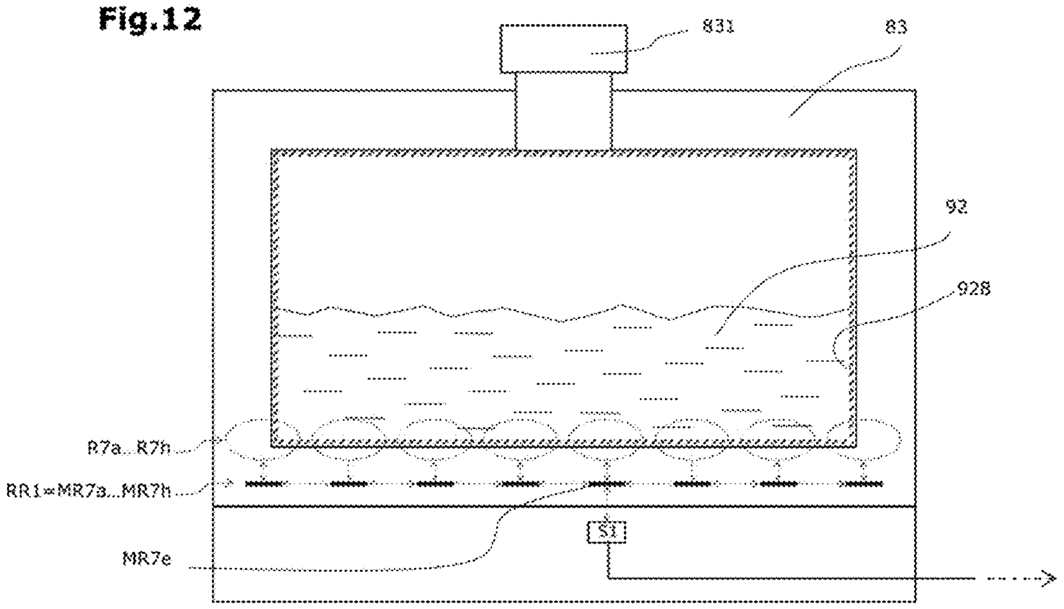
FIG. 12 is a cross-sectional diagram showing an exemplary embodiment of the invention, using an array such as that of FIG. 9 or FIG. 11 implanted in the wall of a tank in order to contactlessly characterize the condition of the internal surface thereof by means of a single probe.

FIG. 12 shows an exemplary implementation of the characterization method, using an array such as that of FIG. 9 or FIG. 11 implanted in the wall of a tank 83 in order to contactlessly characterize the condition of the inner surface 928 thereof by means of a single probe S1.

In this case too, because of the inductive interaction present between the resonators of the array RR1, the probe S1 indirectly detects variations in impedance present in the regions R7*a* to R7*h* which encompass the area of interface between the wall of the tank and the fuel 92 via the individual multifrequency resonator MR7*e* to which it is inductively coupled.

Metamaterial

FIG. 13 shows a use of an array RR1 of multifrequency resonators arranged as a metamaterial in order to interact with an incident electromagnetic field Ci, in particular a magnetic field or the magnetic component of an electromagnetic field. Depending on the changes produced by this metamaterial, this incident field Ci is changed, for example transmitted Cs1, refracted Cs2 or reflected CS3, depending on the characteristics conferred on this metamaterial by the characteristics of the individual resonators thereof.

FIG. 14 shows a use of a flexible film bearing an array RR3 of multifrequency resonators arranged as a metamaterial in order to perform impedance matching by being positioned between the body of a patient 9 and an incident electromagnetic field Ci emitted by a probe S9 of a treatment device.

Of course, the invention is not limited to the examples just described, and many adjustments can be made to these examples without going beyond the scope of the invention.

The invention claimed is:

1. A device comprising a plurality of passive multifrequency electromagnetic resonators each having a plurality of given resonance frequencies,
   each of said resonators comprising a plurality of transmission lines galvanically isolated from one another, having different resonance frequencies from one another, and each forming a path that closes back in on itself and is interrupted by one or more splits (G14),
   said transmission lines being arranged spatially relative to one another such that, when said device is subjected to what is referred to as an incident field (Ci), they share between them a common interaction region in which the field lines of said incident field interact with said plurality of transmission lines,
   said resonators being arranged, without electrical contact between them, so that they are sufficiently close to one another to form an array of resonators that interact with one another through inductive coupling.

2. The device as claimed in claim 1, wherein all or some of the resonators thereof each comprises one or more transmission lines which are each formed by a group of at least two interrupted tracks, arranged parallel to one another but without electrical contact between them and describing the same common path,
   wherein the one or more interruptions of each of the tracks of said group are each arranged facing a solid portion of another track of said group, and in particular of all of the other tracks of said group.

3. The device as claimed in claim 2, wherein a plurality of the multifrequency resonators thereof each comprise a plurality of transmission lines nested within one another, in particular within a two-dimensional surface.

4. The device as claimed in claim 3, wherein a plurality of the multifrequency resonators thereof each comprise a plurality of transmission lines each formed by at least two tracks arranged on two opposite faces of a two-dimensional dielectric substrate, in particular the same substrate common to all or some of the transmission lines of the same multifrequency resonator.

5. The device as claimed in claim 4, wherein the multifrequency resonators are arranged, without electrical contact between them, in a spatially periodic structure arranged to form an electromagnetic metamaterial capable of interacting with an external electromagnetic field, referred to as an incident field.

6. The device as claimed in claim 4, further comprising a flexible or rigid film bearing all or some of the resonators of said device, which film is arranged so as to envelop a living or non-living body, referred to as the target object, in order to modify the interaction thereof with the electromagnetic field, in particular in order to protect said target object or to optimize a treatment or an investigation carried out on said target object by means of said electromagnetic field.

7. The device as claimed in claim 1, wherein the resonators are designed and arranged so as to interact with an incident electromagnetic field in such a way as to filter or attenuate all or some of the frequencies other than the resonance frequencies of said resonators.

8. The device as claimed in claim 1, wherein the resonators are designed and arranged so as to interact with an electromagnetic field passing therethrough in such a way as to amplify the intensity thereof in the resonance frequencies of the resonators.

9. The device as claimed in claim 1, wherein the resonators are designed and arranged so as to interact with an incident electromagnetic field in such a way as to deflect, refract or reflect all or some of the intensity thereof in one or more frequencies.

10. The device as claimed in claim 1, wherein the resonators are designed and arranged so as to interact with an electromagnetic field passing therethrough in such a way as to modify the impedance of an incident signal carried by said electromagnetic field or of an answer signal brought about by said field and passing through said device.

11. A method for modifying the interaction of a living body or of an object with an incident electromagnetic field, the method comprising placing, holding or activating the device as claimed in claim 1 around said body or object or between same and a source of said incident field.

12. A method for characterizing at least one region to be investigated within a medium to be characterized, the method comprising at least the following steps:

contactlessly inductively coupling a probe, simultaneously, to one or more multifrequency resonators, referred to as probed resonators, constituting a subset of an array of resonators formed by the device as claimed in claim 1, said array being located in the vicinity of said investigated region but without requiring contact with said investigated region, such that the resonators of said array interact with the region to be investigated;

measuring the variation in impedance of said probed resonators by means of a reader that interacts with said probe;

processing said measurement of variation in impedance, comprising a spectral analysis according to frequency, so as to determine a plurality of individual impedances measured for a plurality of measurement frequencies; and processing one or more of said individual impedances in order to extract one or more electrical properties of said investigated region.

13. The method as claimed in claim 12, wherein the array comprises different types of multifrequency resonators having combinations of different frequencies, the resonators being spatially distributed within said array so that different regions (RR2*a*, RR2*b*) have different combinations of frequencies, in particular by virtue of different resonators or different combinations of different resonators.

14. A system for contactlessly characterizing at least one region referred to as an investigated region within a medium to be characterized, the system comprising:

at least one device as claimed in claim 1 forming an array of resonators that interact with one another via inductive coupling and the transmission lines of which interact with the region to be investigated, the device being intended to be arranged in the vicinity of said investigated region, but without requiring contact with said investigated region, at least one probe arranged so as to:

on the one hand, be coupled via inductive coupling to one or more resonators of said array of resonator (typically to only some of the resonators of the array) by means of an inductive loop circuit, and on the other hand, interact with at least one reader;

said reader being arranged so as to interact with said probe in such a way as to implement a method for characterizing the at least one region to be investigated within the medium to be characterized, the method comprising at least the following steps:

contactlessly inductively coupling a probe, simultaneously, to one or more multifrequency resonators, referred to as probed resonators, constituting a subset of an array of resonators formed by said at least one device, said array being located in the vicinity of said investigated region but without requiring contact with said investigated region, such that the resonators of said array interact with the region to be investigated;

measuring the variation in impedance of said probed resonators by means of a reader that interacts with said probe;

processing said measurement of variation in impedance, comprising a spectral analysis according to frequency, so as to determine a plurality of individual impedances measured for a plurality of measurement frequencies; and processing one or more of said individual impedances in order to extract one or more electrical properties of said investigated region.

* * * * *